US007232316B2

(12) United States Patent
Chen

(10) Patent No.: US 7,232,316 B2
(45) Date of Patent: Jun. 19, 2007

(54) ELECTRICAL CONNECTOR WITH IMPROVED SHIELDING MEANS

(75) Inventor: Ming-Ching Chen, TuCheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/389,701

(22) Filed: Mar. 27, 2006

(65) Prior Publication Data

US 2006/0216996 A1 Sep. 28, 2006

(30) Foreign Application Priority Data

Mar. 25, 2005 (CN) .................. 2005 2 0070138 U

(51) Int. Cl.
*H01R 12/00* (2006.01)
*H05K 1/00* (2006.01)

(52) U.S. Cl. ........................................ 439/71; 439/607

(58) Field of Classification Search ................ 439/607, 439/71, 330
See application file for complete search history.

(56) References Cited

U.S. PATENT DOCUMENTS

| | | | | |
|---|---|---|---|---|
| 5,622,522 | A * | 4/1997 | Tan et al. | 439/607 |
| 6,764,338 | B2 * | 7/2004 | Fang | 439/607 |
| 6,939,172 | B2 * | 9/2005 | Lu | 439/607 |
| 2003/0218873 | A1 | 11/2003 | Eromaki et al. | |
| 2004/0068868 | A1 | 4/2004 | Nishio et al. | |

* cited by examiner

*Primary Examiner*—Tulsidas C. Patel
*Assistant Examiner*—Vladimir Imas
(74) *Attorney, Agent, or Firm*—Wei Te Chung

(57) ABSTRACT

A shielded electrical connector (100) for receiving a module includes a shielding shell (3) mounted to a printed circuit board, an insulative housing (1) assembled to the shell and equipped with a number of contacts (2). Each contact has a contacting portion (22) for contacting with the module and a soldering portion (23) extending beyond the shell for connection to the printed circuit board. The shell comprises a bottom plate (32) extending in a direction perpendicular to the module insertion direction and a plurality of side plates (310, 311, 312, 313) extending upwardly from the bottom plate and cooperating with the bottom plate to form a receiving space for receiving the module. Every two adjacent side plates are connected to each other.

20 Claims, 10 Drawing Sheets

ELECTRICAL CONNECTOR WITH IMPROVED SHIELDING MEANS

BACKGROUND OF THE INVENTION

1. Field of the invention

The present invention generally relates to a shielded electrical connector, particularly to a shielded electrical connector for receiving an electrical element therein.

2. Description of Related Art

A conventional shielded electrical connector described in U.S. patent application Publication No. 2003/0218873 comprises a fastening structure for fastening an electrical element 3 having a plurality of projections. The fastening structure comprises a frame 1 with a plurality of flexible strips 11 arranged therearound, and an adapter 2 with a plurality of U-shaped contacts mounted on. However, there are a plurality of slots between adjacent strips, therefore, electromagnetic radiation of certain frequency could penetrate through the slots, the connector could not achieve desirable effect of preventing electromagnet interference. Furthermore, the adapter 2 together with the terminals is placed between the electrical element 3 and a bottom of the frame 1, each U-shaped terminal having a soldering portion formed at a free end thereof and located below the adapter, the soldering portions extend outwardly from the bottom of the frame 1 for soldering onto a print circuit board, in this way, the electrical connector is located on one side of the printed circuit board, therefore the electrical connector together with the printed circuit board would occupy too many spaces in the height direction.

It is thus desired to provide a shielded electrical connector assembly to overcome the shortcomings described above.

SUMMARY OF THE INVENTION

An object of the present invention is to provide an electrical connector having superior shielding characteristics.

Another object of the present invention is to provide an electrical connector for surface mounting to a printed circuit board.

In order to achieve above-mentioned objects, a shielded electrical connector for receiving a module includes a shielding shell mounted to a printed circuit board, an insulative housing assembled to the shell and equipped with a plurality of contacts. Each contact has a contacting portion received in the receiving space for contacting with said module and a soldering portion extending beyond the shell for mounting to the printed circuit board. The shell comprises a bottom plate extending in a direction perpendicular to the module insertion direction and a plurality of side plates extending upwardly from the bottom plate and cooperating with the bottom plate to form a receiving space for receiving the module, every two adjacent side plates are electrically connected to each other.

Other objects, advantages and novel features of the present invention will become more apparent from the following detailed description of the present embodiment when taken in conjunction with the accompanying drawings.

DETAILED DESCRIPTION OF THE INVENTION

Figure 1:
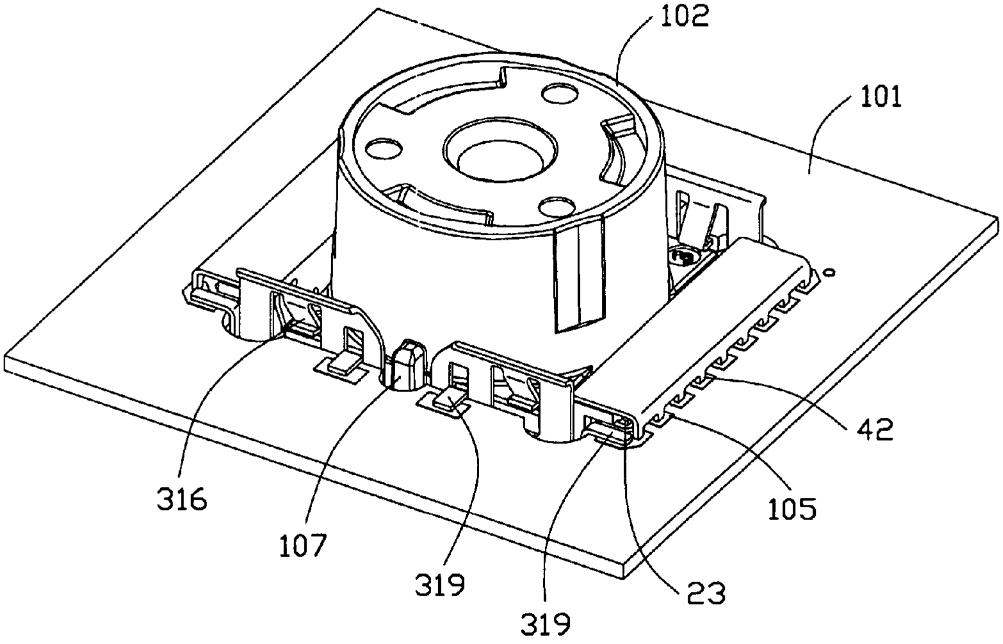
FIG. 1 is a perspective view of an electrical connector mounted on a printed circuit board and receiving a module according to the present invention.

Reference will now be made to the drawing figures to describe the preferred embodiment of the present invention in detail.

Figure 3:
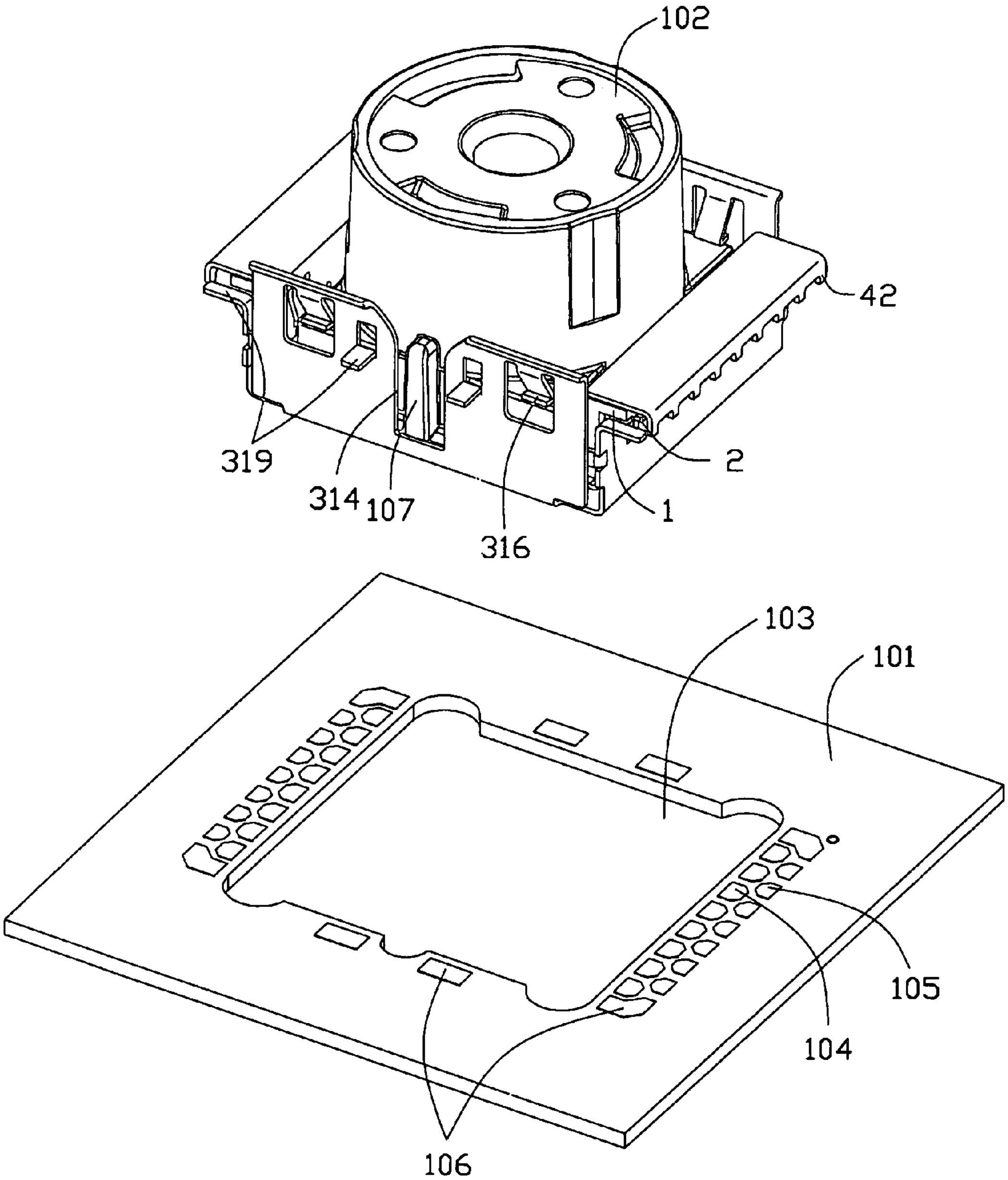
FIG. 3 is a perspective view of the electrical connector receiving the module and being separate from the printed circuit board according to the present invention.
Figure 4:
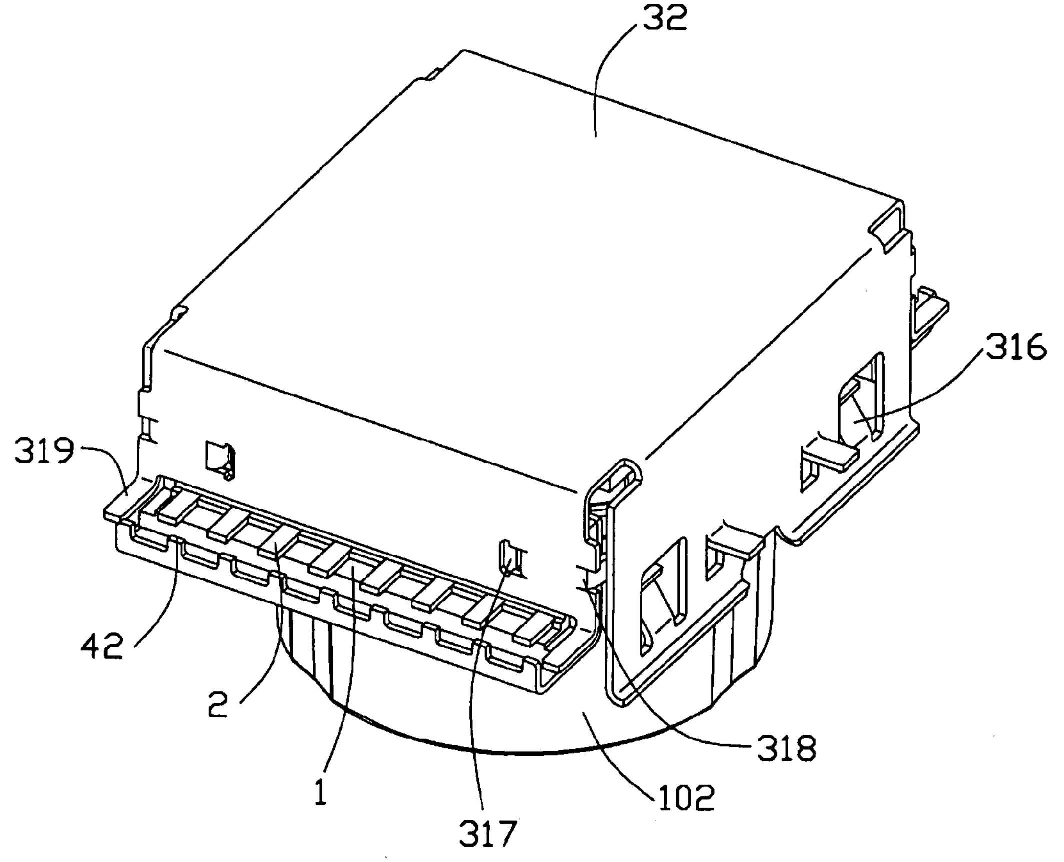
FIG. 4 is a perspective view of the electrical connector receiving the module.
Figure 8:
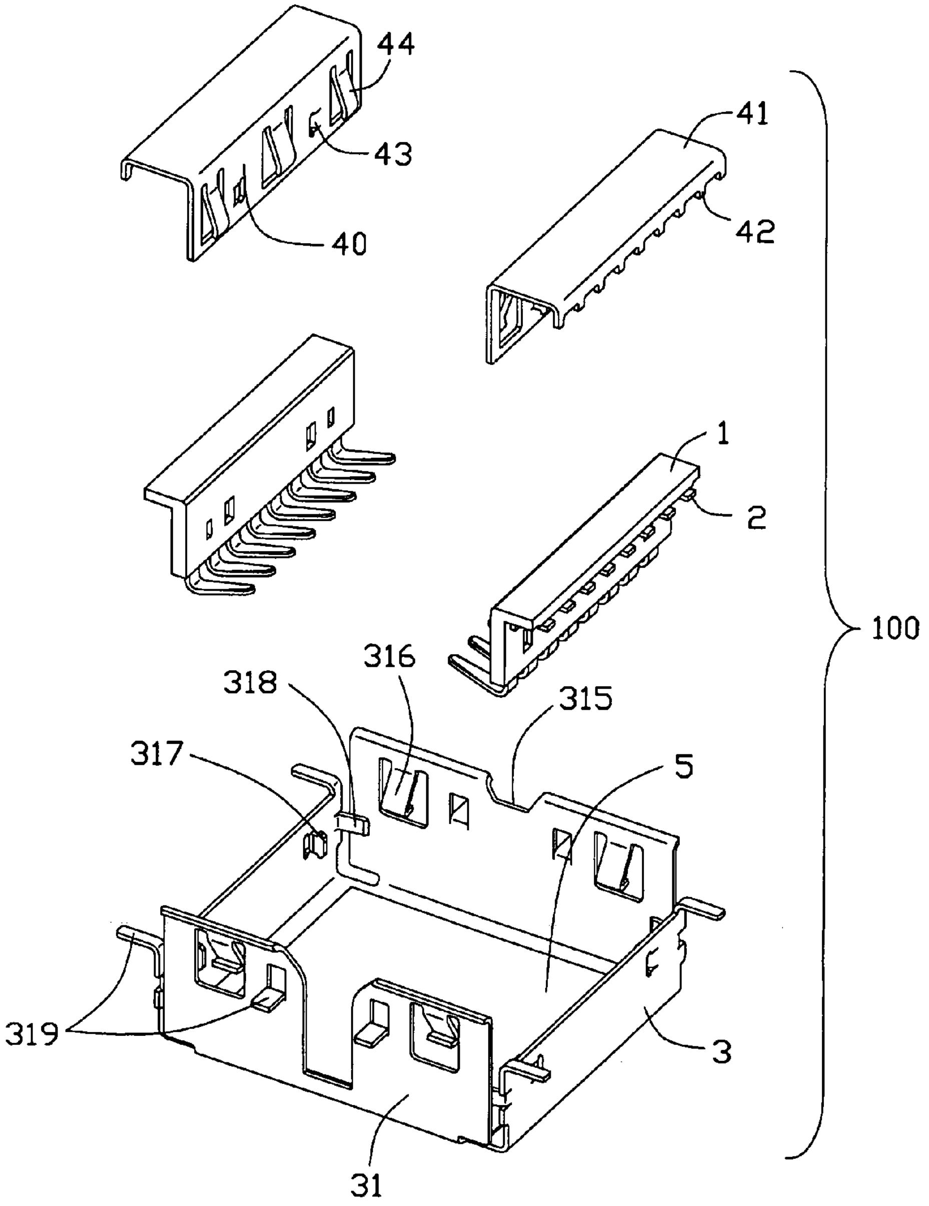
FIG. 8 is a partly assembled perspective view of the electrical connector.

Referring to FIGS. 1, 3 and 8, an electrical connector 100 mounted on a printed circuit board 101 for receiving an electrical module such as camera module 102, comprises an insulative housing 1, a plurality of contacts 2 fixed to the housing 1, an inner shell 4 attached to the housing 1 and a substantially box-like outer shell 3 for receiving the housing 1 and the inner shell 4.

Figure 9:
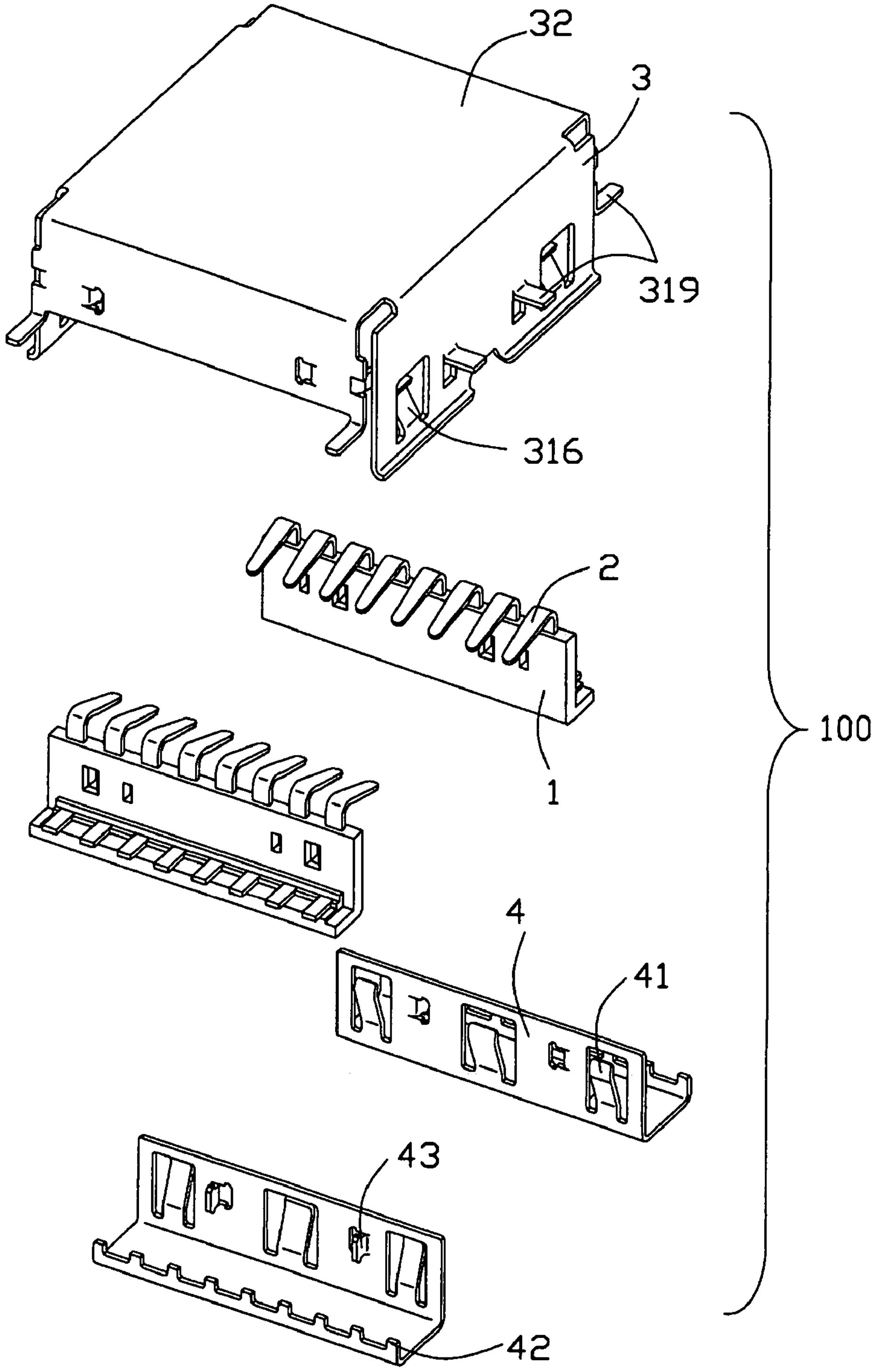
FIG. 9 is another perspective view of FIG. 8 taken from another aspect.
Figure 10:
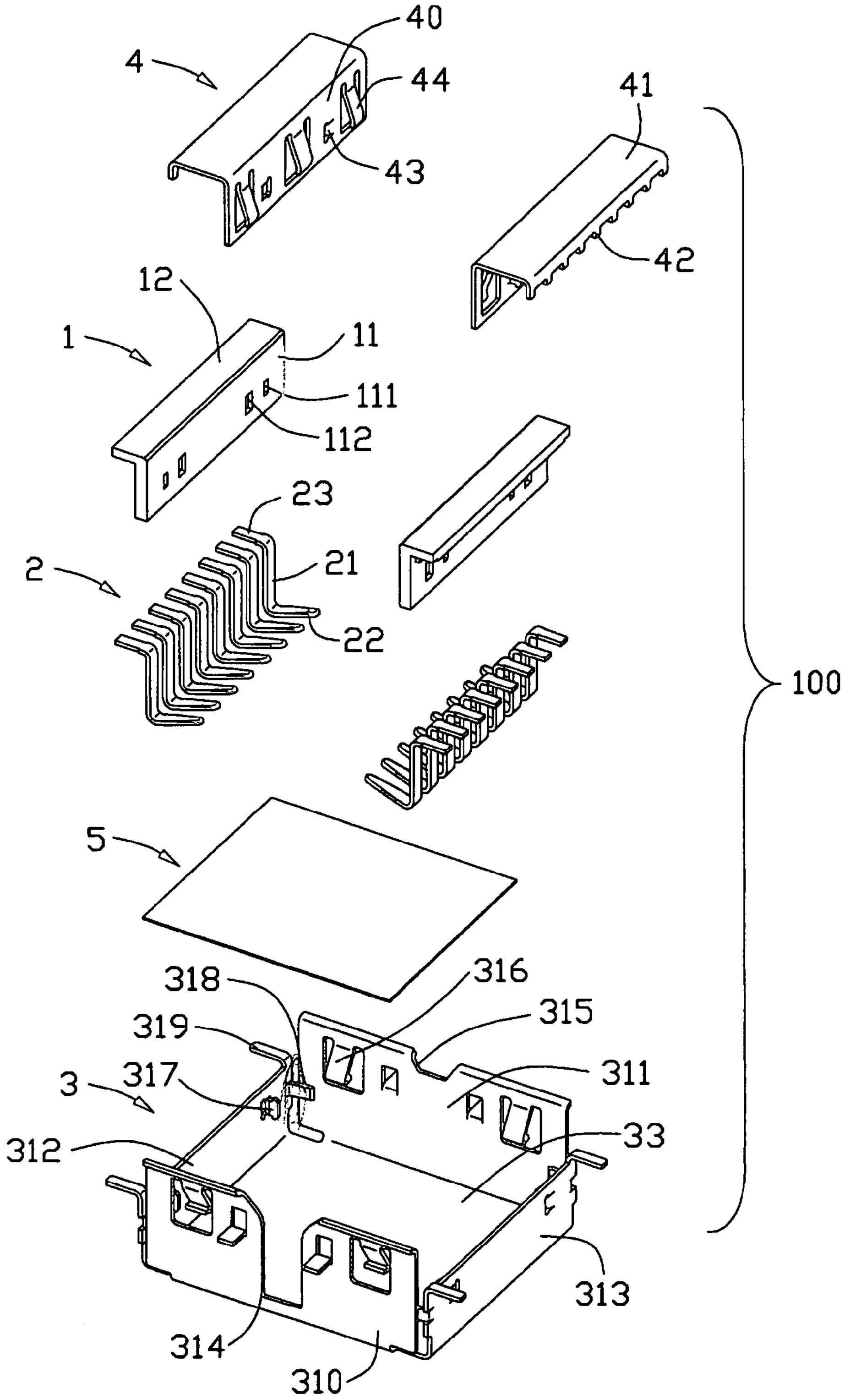
FIG. 10 is an exploded view of the electrical connector.

Referring to FIGS. 9, 10, the insulative housing 1 includes a vertical main portion 11 and a horizontal portion 12 extending laterally from an upper edge of the main portion 11. The main portion 11 is provided with a locking hole 111 for locking with the outer shell 3 and a retention hole 112 for engaging with the inner shell 4.

The contacts 2 are configured in a "Z"-shape, each comprises a vertical intermediate portion 21 insert molded with said housing 1, a contacting portion 22 extending upwardly from a bottom end of the intermediate portion 21 to contact with electrical pads formed on a bottom face of the camera module 102 and a horizontal soldering portion 23 extending laterally and outwardly from an upper end of the intermediate portion 21 and located beneath the horizontal portion 12 of the housing 1. It should be noted that the contacts 2 may be locked with the housing 1 by interference engagement therebetween.

The outer shell 3 comprises a bottom flat plate 32, a pair of side walls 310, 311 and a pair of opposite end walls 312, 313 extending vertically and upwardly therefrom, a receiving space 33 formed therebetween for accommodating the camera module 102. The side walls 310, 311 and the end walls 312, 313 are formed with a number of soldering tabs 319 protrude outwardly and laterally to be in a common plane for connecting with the printed circuit board 101. The side wall 310 is provided with an U-shaped recess 314 for receiving a protrusion 107 formed on a periphery of the camera module 102. A cutout 315 is formed on an upper edge of the side wall 311 for preventing incorrect insertion of the camera module 102, while the camera module 102 is inserted into the receiving space 33 in a wrong direction, a lower edge of the cutout 315 abuts against said protrusion 107, thus preventing further insertion of said camera module 102.

The side walls 310, 311 each includes a pair of resilient fingers 316 protruding inwardly for pressing the camera module 102 received in the receiving space 33. The end waUs 312, 313 have a number of locking tabs 317 formed with barbs for interference engagement with said locking hole 111 of the housing 1. The side walls 310, 311 and end walls 312, 313 have a connection device such as a plurality of connecting tabs 318 extending laterally from side edges of the side walls 310, 311 and end walls 312, 313. The connecting tabs 318 establish interconnection between a side wall and a corresponding end wall adjacent to the side wall, in this way, said side walls 310, 311, end walls 312, 313 and the bottom flat plate 32 are connected together to define a shielding case for surrounding the camera module 102, thereby achieving a more desirable effect of preventing electromagnetic interference.

The inner shell 4 has a vertical body portion 40 and a horizontal portion 41 extending laterally from an upper edge of said vertical portion 40, said vertical portion 40 has a number of flexible fingers 44 protruding inwardly for pressing the camera module 102, and a pair of locking tabs 43 extending outwardly for locking with retention hole 112. A number of grounding tabs 42 are formed on a lower edge of the horizontal portion 41.

The electrical connector 100 further comprises a thin insulative plate 5 made of insulative materials such as mylar and positioned on the bottom plate 32 of the outer shell 3, thus eliminating electrical connection between the contacts 2 and the bottom plate 32 of the outer shell 3.

In assembly, The housings 1 are attached to end walls 312, 313 via interference engagement between locking tabs 317 of end walls 312, 313 and locking holes 111 of the housings 1, the horizontal portions 12 straddle on upper edges of the end walls 312, 313, the vertical portions 11 of the housings 1 and the contacting portions 22 of the contacts 2 are received in the receiving space 33 of the outer shell 3, wherein the contacting portions 22 of the contacts 2 are disposed over the insulative plate 5. The horizontal soldering portions 23 of the contacts 2 extend outside end walls 312, 313 for mounting onto the printed circuit board 101.

The locking tabs 43 of inner shells 4 are locked with retention holes 112 of the housings 1, thus retaining the inner shells 4 to the housings 1. When the electrical connector 100 penetrates through a opening 103 of the printed circuit board 101 for mounting onto the printed circuit board 101, the grounding tabs 42 of the inner shell 4, the horizontal soldering portions 23 of the contacts 2 and the soldering tabs 319 lie in a common plane for surface mounting to first solder pads 105, second solder pads 104, third solder pads 106 of the printed circuit board 101 respectively.

Figure 2:
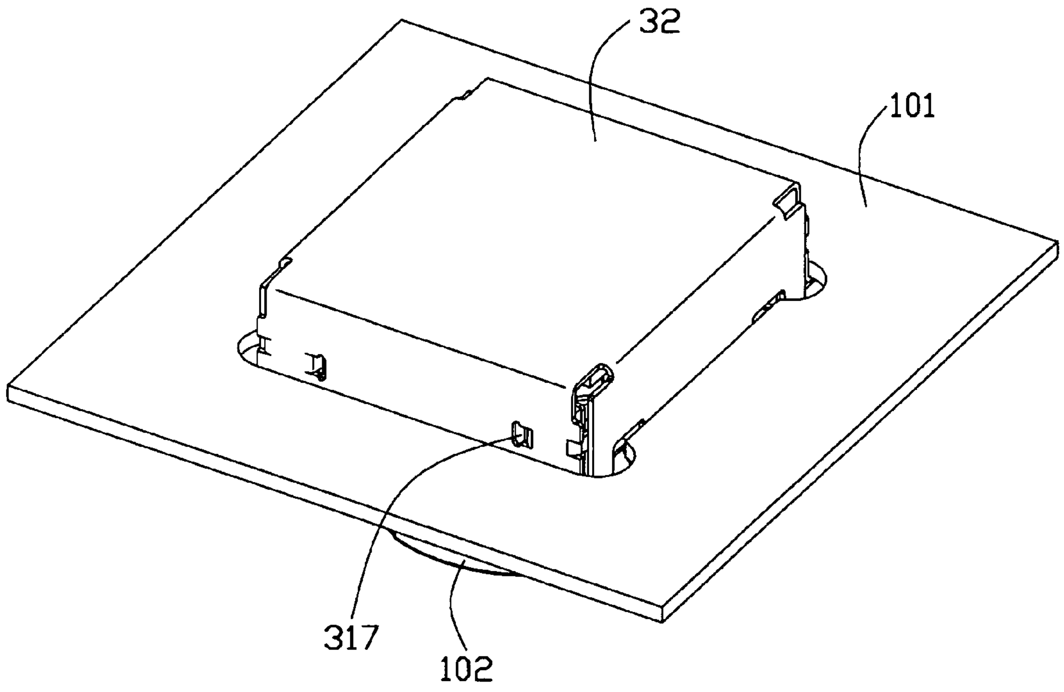
FIG. 2 is another perspective view of FIG. 1 taken from another aspect.
Figure 5:
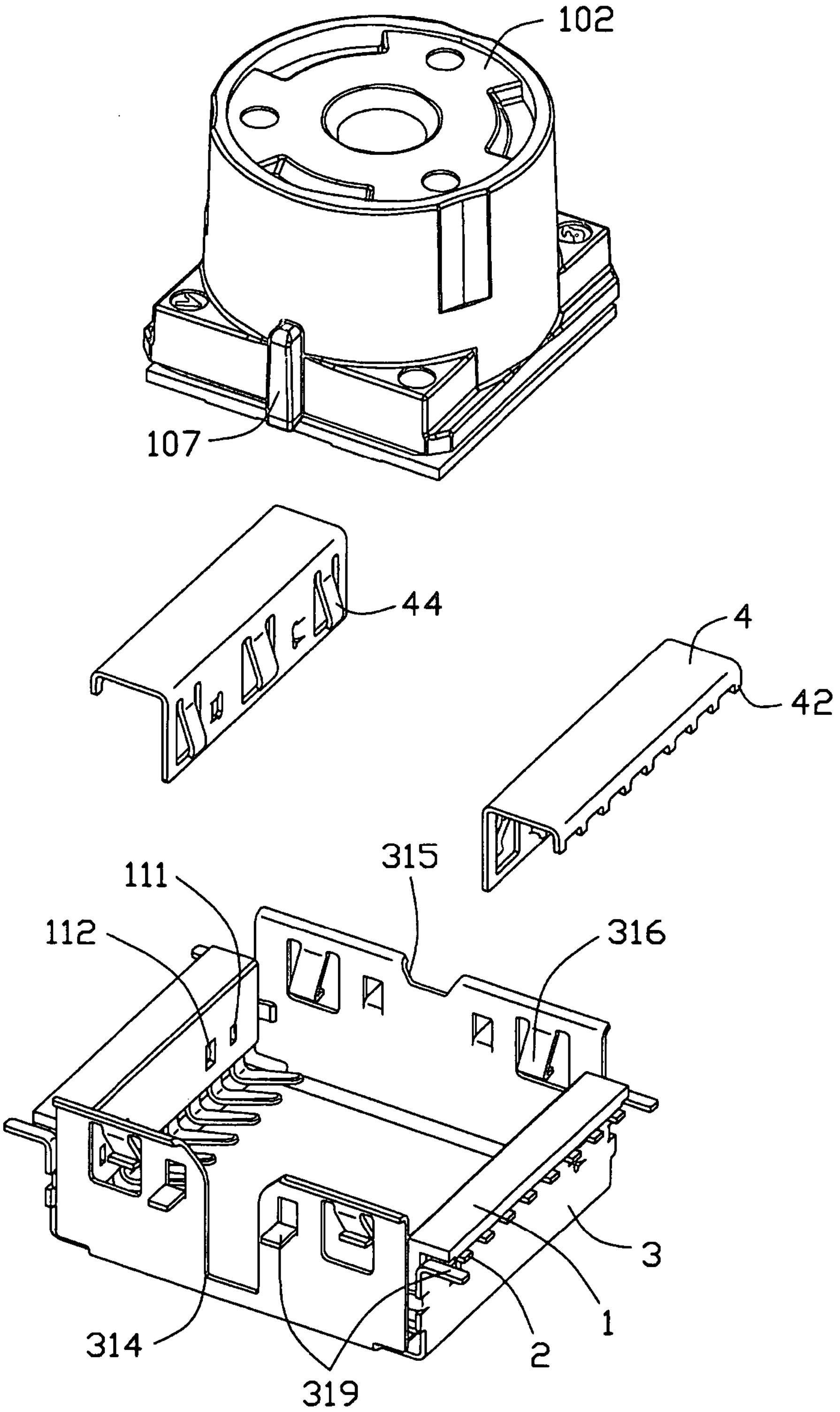
FIG. 5 is a partly assembled perspective view of the electrical connector and the module.
Figure 6:
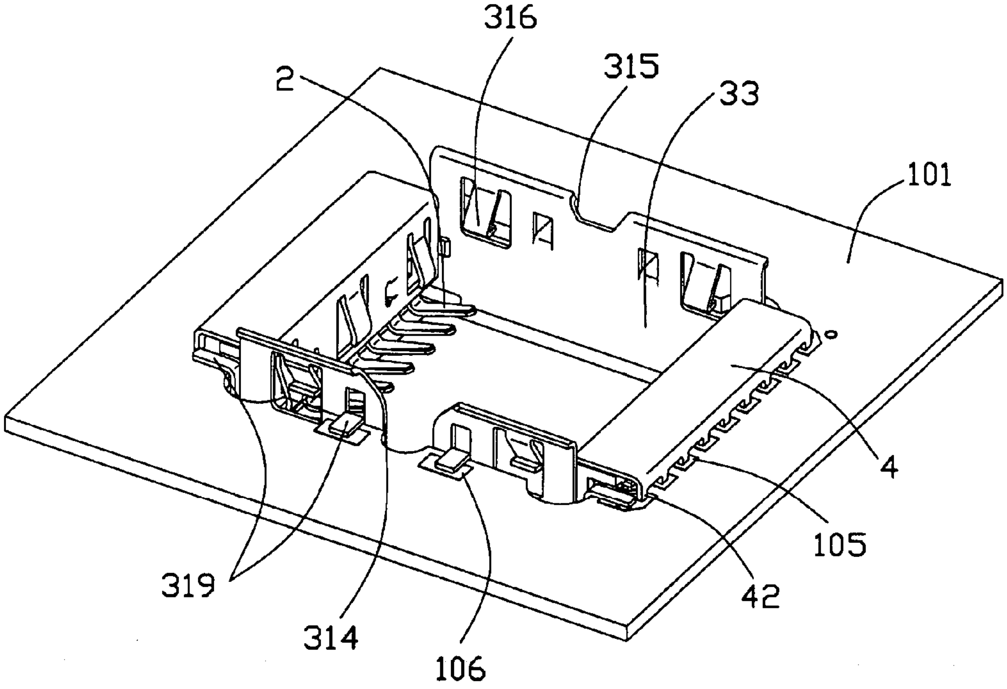
FIG. 6 is a perspective view of the electrical connector mounted on the printed circuit board.
Figure 7:
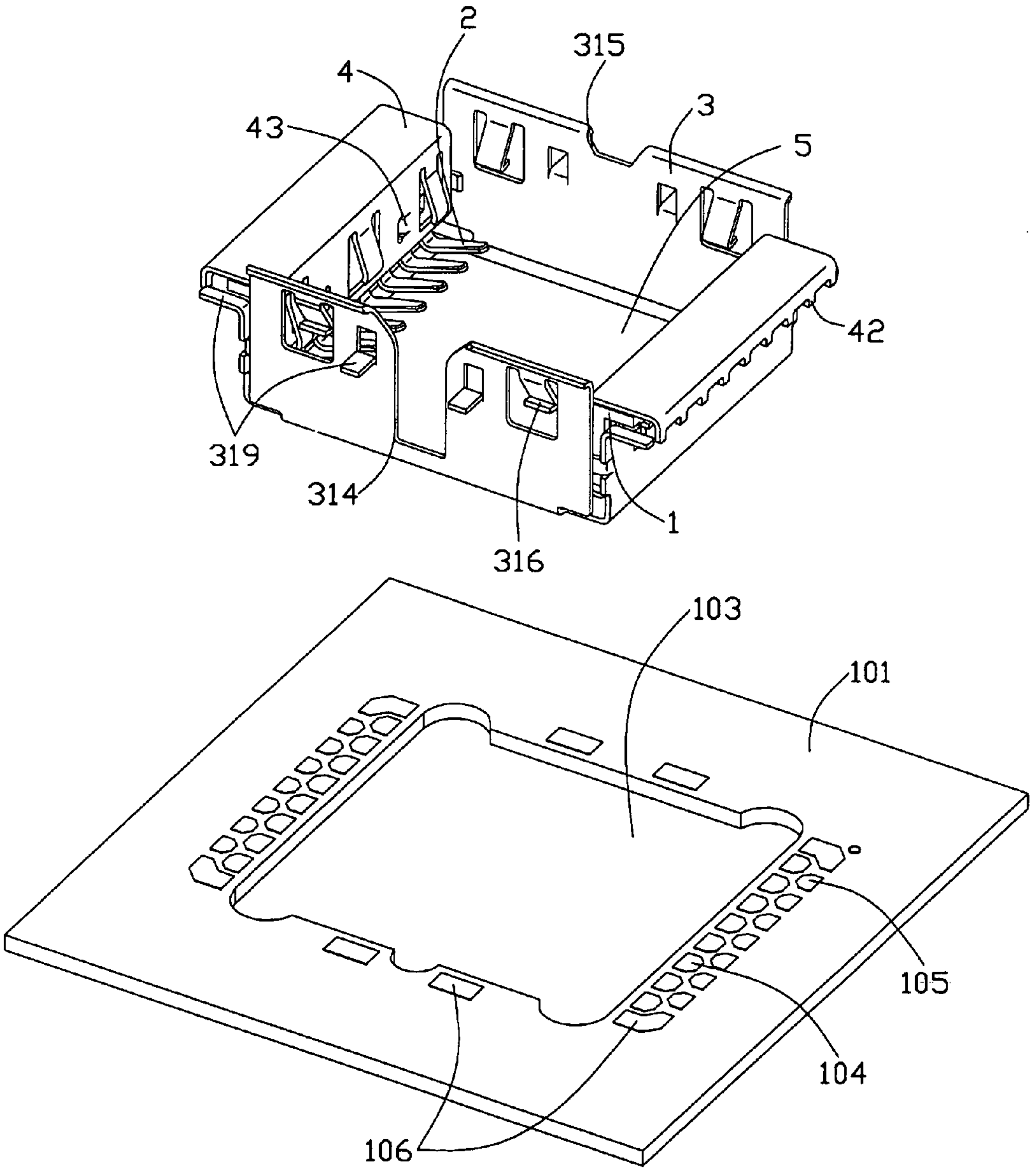
FIG. 7 is a perspective view of the electrical connector separate from the printed circuit board.

Referring to FIGS. 2, 5, When said camera module 102 are inserted into the receiving space 33 of the outer shell 3, the protrusion 107 of the camera module 102 is guided into the U-shaped recess 314 of the outer shell 3. The flexible fingers 44 of the inner shell 4 and the resilient fingers 316 of the outer shell 3 commonly abut against the camera module 102 to retain the camera module 102 in the receiving space 33. Electrical pads on a lower surface of the camera module 102 come into contact with the contacting portions 22 of the contacts 2, thereby establishing electrical connection between the module 100 and the camera module 102.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A shielded electrical connector for electrically connecting a module to a printed circuit board, comprising:

a shielding shell mounted to the printed circuit board comprising a bottom plate, a plurality of side plates extending perpendicularly from the bottom plate and a receiving space defined therebetween for receiving the module, wherein a connection device is provided on a side edge of at least one of every two adjacent side plates for electrically connecting the two adjacent side plates; and an insulative housing assembled to the shell and equipped with a plurality of contacts, each contact having a contacting portion received in the receiving space for contacting with said module and a soldering portion extending beyond the shell for mounting to the printed circuit board.

2. The shielded electrical connector as claimed in claim 1, wherein the connection device comprises connecting tabs projecting laterally from side edges of the side plates for abutting against the adjacent side plates.

3. The shielded electrical connector as claimed in claim 1, wherein the shell defines a plurality of soldering tabs extending outwardly and laterally from side plates for surface mounting on the printed circuit board.

4. The shielded electrical connector as claimed in claim 1, wherein one of said side plates defines thereon a recess for receiving a corresponding protrusion formed on a periphery of the module.

5. The shielded electrical connector as claimed in claim 1, wherein a cutout is provided on an upper edge of one of the side plates of the shell for preventing incorrect insertion of the module.

6. The shielded electrical connector as claimed in claim 1, wherein the side plates have a plurality of resilient fingers projecting inwardly for pressing against the module.

7. The shielded electrical connector as claimed in claim 1, wherein the housing includes two individual sections attached to two opposite side plates respectively and wherein each section has a vertical portion locked with the side plate of the shell and a horizontal portion extending outwardly and straddling on an upper edge of the side plate.

8. The shielded electrical connector as claimed in claim 7, further comprising two shielding plates received in the receiving space, wherein each of said shielding plates cooperates with corresponding side plate to have corresponding section of the housing sandwiched therebetween.

9. The shielded electrical connector as claimed in claim 8, wherein the shielding plates are attached to the two sections of the housing respectively and define a number of flexible tabs projecting inwardly for pressing against the module.

10. The shielded electrical connector as claimed in claim 9, wherein the shielding plate comprises a vertical portion, and a horizontal portion extending beyond side plates of the shell and having a plurality of grounding tabs for surface mounting to the circuit board.

11. The shielded electrical connector as claimed in claim 1, further comprising an insulative plate placed on the bottom plate of the shell to prevent the contacts from contacting with the bottom plate.

12. The shielded electrical connector as claimed in claim 11, wherein the contacts are configured in a “2” shape.

13. The shielded electrical connector as claimed in claim 12, wherein the contacts are formed integrally with the housing.

14. A shielded electrical connector, through which a module is electrically connected to a printed circuit board having a cutout, comprising:

a one-piece shell mounted to the printed circuit board through the cutout, said shell comprising a bottom wall, side walls extending perpendicularly from periphery edges of the bottom wall, and connecting members formed between and electrically connecting every two adjacent side walls;

contact inserts received in said shell each including an insulative housing and a plurality of contacts embedded in said housing, each contact comprising a contacting portion inwardly extending above said bottom wall of said shell; and an insulative device provided between said contacting portions and said bottom wall.

15. The shielded electrical connector as claimed in claim 14, further comprising a pair of shielding plates each attached to respective contact insert.

16. The shielded electrical connector as claimed in claim 14, wherein the insulative device is located on the bottom wall of the shell and positioned beneath the contacting portions of the contacts.

17. The shielded electrical connector as claimed in claim 14, wherein said one-piece shell comprises a plurality of solder tabs formed adjacent to an upper edge of said side walls and extending outwardly for soldering to solder pads arranged on said printed circuit board around said cutout.

18. An electrical connector assembly, comprising:

a printed circuit board defining opposite first and second surfaces with an opening extending through both said first and second surfaces in a confinement manner;

an electrical connector comprising:

a metallic shield defining a horizontal main wall with a plurality of side walls extending therefrom and commonly defining a box type configuration with a receiving cavity therein, said metallic shield disposed in the opening under a condition that the bottom wall is closer to the first surface tan to the second surface while free ends of the side walls are closer to the second surface than to the first surface; and a contact module assembled to the housing and including a plurality of contacts, each of said contacts defining a contact portion closer to the first surface than to the second surface, and a mounting portion closer to the second surface than to the first surface; wherein said housing, said shield and said printed circuit board are configured to have said housing assembled to the shield in a direction along which the shield is assembled to the printed circuit board.

19. The connector assembly as claimed in claim 18, wherein said bottom wall essentially fully occupies the opening in said direction.

20. The connector assembly as claimed in claim 18, wherein another metallic shell is assembled to at least one of said housing and said shield so as to cooperate wit said metallic shield to sandwich the housing therebetween.

* * * * *